United States Patent [19]

Okumura

[11] Patent Number: 4,891,327
[45] Date of Patent: Jan. 2, 1990

[54] METHOD FOR MANUFACTURING FIELD EFFECT TRANSISTOR

[75] Inventor: Yoshinori Okumura, Hyogo, Japan

[73] Assignee: Mitsubishi Denki Kabushiki Kaisha, Tokyo, Japan

[21] Appl. No.: 227,841

[22] Filed: Aug. 3, 1988

[30] Foreign Application Priority Data

Aug. 4, 1987 [JP] Japan ................. 62-195704

[51] Int. Cl.$^4$ ............... H01L 27/04; H01L 29/78
[52] U.S. Cl. ...................... 437/41; 437/59;
   437/52; 437/60; 437/48; 357/23.6; 357/23.9;
   357/51
[58] Field of Search ............ 437/59, 52, 60, 41,
   437/47, 48, 49, 50, 52; 357/23.6, 23.9, 51

[56] References Cited

U.S. PATENT DOCUMENTS

| | | | |
|---|---|---|---|
| 4,183,040 | 1/1980 | Rideout | 437/59 |
| 4,240,845 | 12/1980 | Esch et al. | 437/60 |
| 4,505,023 | 3/1985 | Tseng et al. | 437/29 |
| 4,735,915 | 4/1988 | Kita et al. | 437/59 |

FOREIGN PATENT DOCUMENTS

| | | | |
|---|---|---|---|
| 0013769 | 1/1982 | Japan | 437/41 |
| 0218162 | 12/1983 | Japan | 437/47 |

OTHER PUBLICATIONS

IBM Technical Disclosure Bulletin, vol. 18, No. 4, Sept. 1975, pp. 1019-1020.

VSLI Technology, Section 6.5.5, pp. 249-250, 1983, by S. M. Sze.

Koyanagi et al., "Novel High Density, Stacked Capacitor MOS RAM" IEDM 1978: 348,351.

*Primary Examiner*—Brian E. Hearn
*Assistant Examiner*—Tuan Nguyen
*Attorney, Agent, or Firm*—Lowe, Price, Leblanc, Becker & Shur

[57] ABSTRACT

Impurities of a conductivity type opposite to a semiconductor substrate are ion-implanted utilizing as a mask a resist or the like formed on the major surface of the semiconductor substrate. Impurity regions spaced apart from each other by a predetermined distance are formed by heat treatment. Conductive layers are formed over the respective impurity regions. A conductive material is formed on an exposed semiconductor substrate through an oxide film to cover the conductive layers, and patterned in a predetermined shape. In addition, conductive layers spaced apart form each other by a predetermined distance are formed on the major surface of the semiconductor substrate. Impurities of the conductivity type opposite to that of the semiconductor substrate are ion-implanted into the conductive layers. The impurities included in the conductive layers are diffused into the semiconductor substrate by heat treatment, so that impurity regions spaced apart from each other by a predetermined distance are formed. A conductive material is formed on the exposed semiconductor substrate through an oxide film to cover the conductive layers, and patterned in a predetermined shape.

12 Claims, 11 Drawing Sheets

FIG.11C in
METHOD FOR MANUFACTURING FIELD EFFECT TRANSISTOR

BACKGROUND OF THE INVENTION

1. Field of the Invention

The present invention relates generally to a method for manufacturing a field effect transistor, and more particularly, to a method for manufacturing a field effect transistor employed in a semiconductor memory device or the like which is directed toward high integration density.

2. Description of the Prior Art

Figure 1:
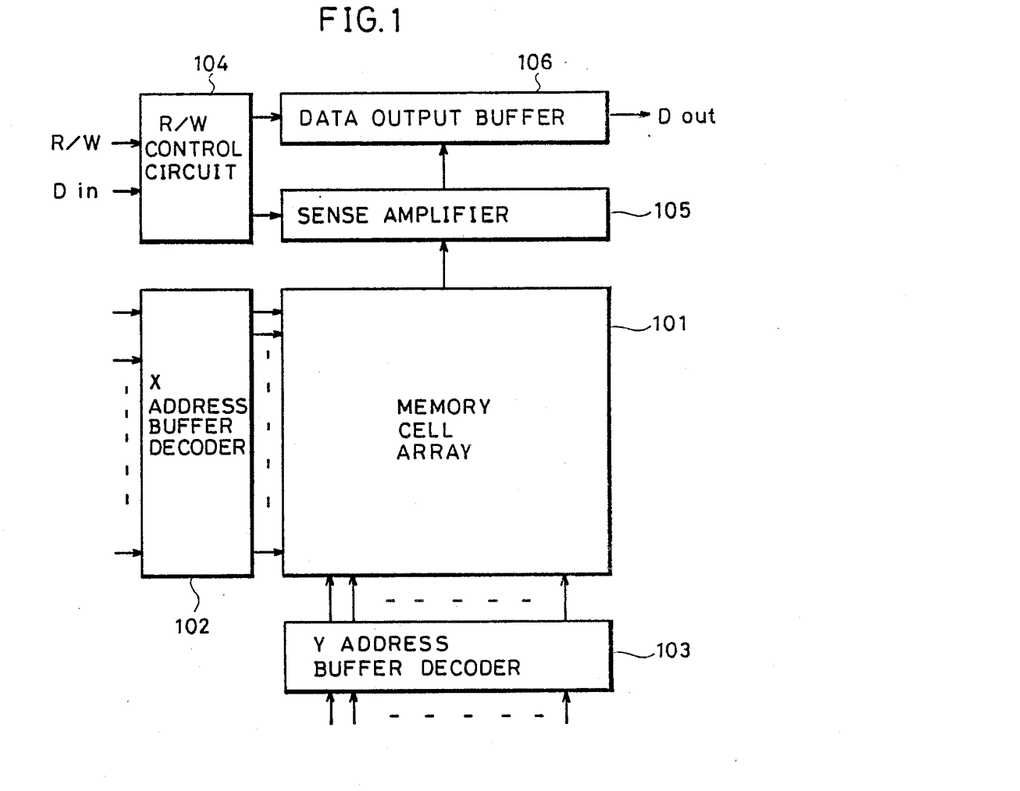
FIG. 1 is a block diagram showing an example of structure of a general RAM, showing components around a memory cell array.

FIG. 1 is a block diagram showing an example of structure of a general RAM (Random Access Memory). In FIG. 1, a memory cell array 101 has a plurality of word lines and a plurality of bit lines arranged intersecting with each other, a memory cell being provided at each of intersections of the word lines and the bit lines. The memory cell is selected on the basis of an intersection of one word line selected by an X address buffer decoder 102 and one bit line selected by a Y address buffer decoder 103. Data is written to the selected memory cell or data stored in the memory cell is read out. The writing/reading of data is designated in response to a read/write control signal (R/W) applied to an R/W control circuit 104. At the time of writing data, input data (Din) is inputted to the selected memory cell through the R/W control circuit 104. On the other hand, at the time of reading out data, the data stored in the selected memory cell is detected and then, amplified by a sense amplifier 105, to be outputted to the exterior through a data output buffer 106 as output data (Dout).

Figure 2:
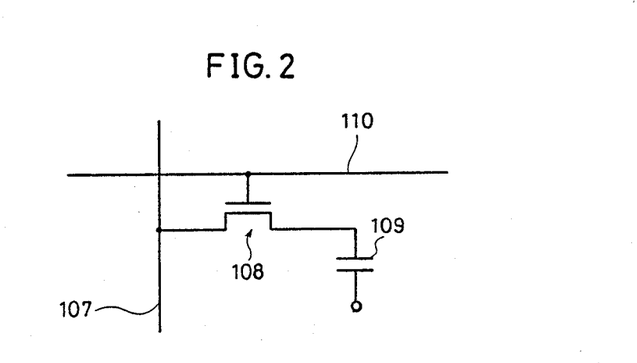
FIG. 2 is an equivalent circuit diagram of a dynamic memory cell.

FIG. 2 is an equivalent circuit diagram of a dynamic memory cell shown for explaining a read/write operation of the memory cell.

In FIG. 2, the dynamic memory cell comprises a set of a field effect transistor 108 and a capacitor 109. A gate electrode of the field effect transistor 108 is connected to a word line 110, and source and drain electrodes are connected to the capacitor 109 and to a bit line 107, respectively. At the time of writing data, a predetermined potential is applied to the word line 110 so that the field effect transistor 108 is rendered conductive, whereby charges applied to the bit line 107 is stored in the capacitor 109. On the other hand, at the time of reading out data, a predetermined potential is applied to the word line 110 so that the field effect transistor 108 is rendered conductive, whereby the charges stored in the capacitor 109 is extracted through the bit line 107.

Figure 3:
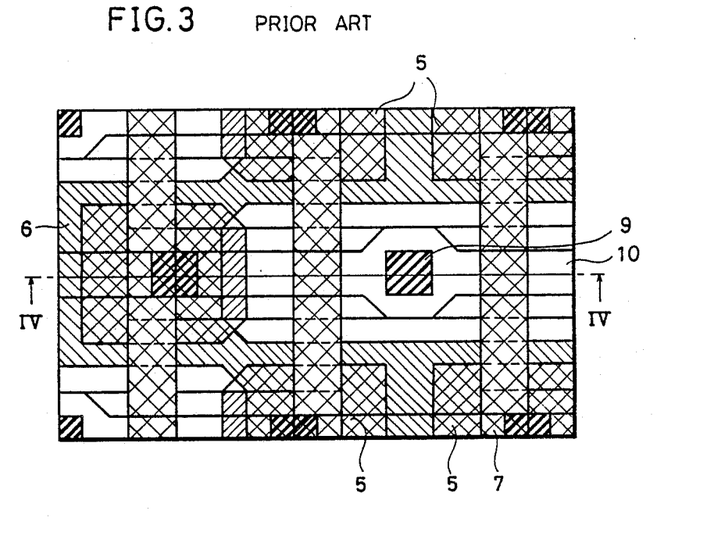
FIG. 3 is a plan view of a conventional device showing a part of the memory cell array shown in FIG. 1.
Figure 4:
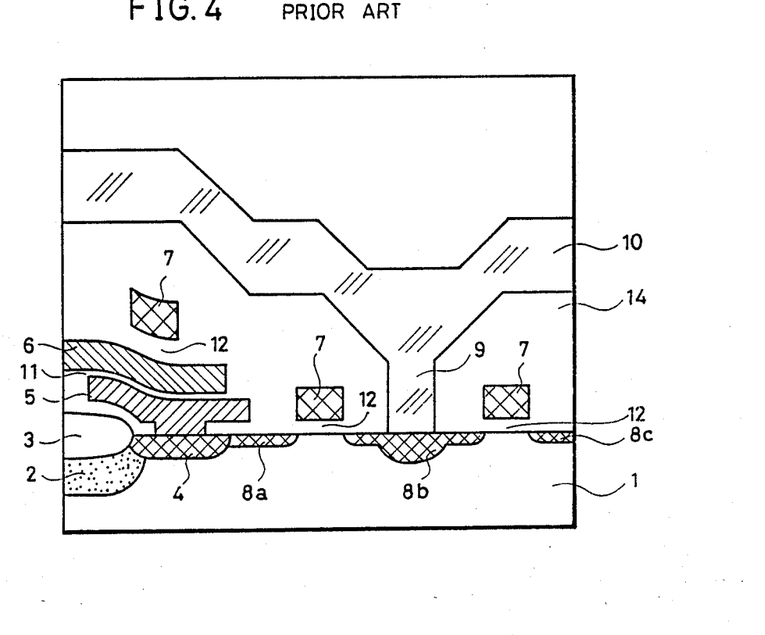
FIG. 4 is a cross sectional view taken along a line IV—IV shown in FIG. 3, showing specific structure of a memory cell.

FIG. 3 is a plan view showing a part of the memory cell array shown in FIG. 1, and FIG. 4 is a cross sectional view taken along a line IV—IV shown in FIG. 3.

Referring now to FIGS. 3 and 4, the structure thereof will be described. A cell isolation region is formed on a semiconductor substrate 1, the cell isolation region comprising an ion diffused layer 2 of the same conductivity type as that of the substrate 1 and a thick oxide film 3. In addition, a capacitor region is formed, the capacitor region comprising an ion diffused layer 4 of a conductivity type opposite to that of the semiconductor substrate 1 for forming a direct contact, a storage node 5 formed of polysilicon (polycrystalline silicon) material or the like for storing charges and a cell plate electrode 6 formed of the polysilicon material or the like.

In addition, a transfer gate transistor region is formed, the transfer gate transistor region comprising a transfer gate electrode 7 comprising a polysilicon single layer, two-layer structure of polysilicon and refractory metal silicide or a refractory metal single layer and ion diffused layers 8 (8a, 8b, 8c) of the conductivity type opposite to that of the semiconductor substrate 1 for forming source and drain regions. An interlayer insulating film 14 of an oxide film is formed to cover the capacitor region and the transfer gate transistor region. A contact hole 9 is formed in the interlayer insulating film 14 to make contract with the ion diffused layer 8b. A bit line 10 comprising the two-layer structure of polysilicon and refractory metal or the refractory metal is formed on the interlayer insulating film 14 so as to be connected to the ion diffused layer 8b through the contact hole 9. A thin insulating film 11 comprising multilayer structure of an oxide film and a nitride film is formed between the storage node 5 and the cell plate electrode 6, and an insulating film 12 of an oxide film is formed under the transfer gate electrode 7.

Such a memory cell is generally manufactured in the order of the cell isolation region, the memory capacitor region, the transfer gate transistor region and the bit line or in the order of the cell isolation region, the transfer gate transistor region, the memory capacitor region and the bit line.

Figure 5A:
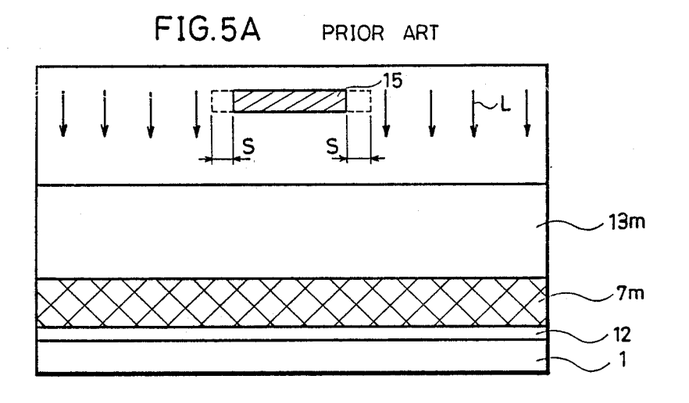
FIGS. 5A to 5D are schematic cross sectional views showing the steps of a manufacturing method of a transfer gate transistor region shown in FIG. 4.
Figure 5B:
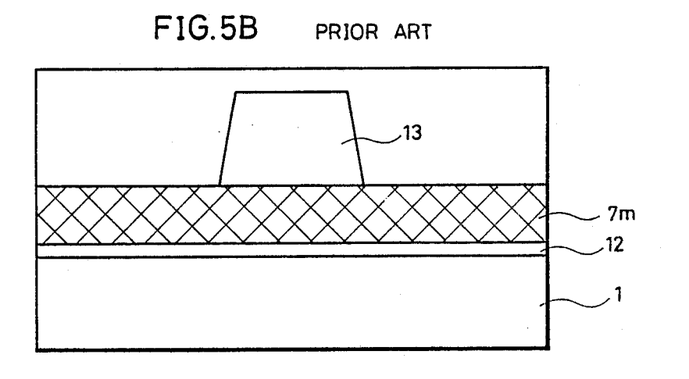
Figure 5C:
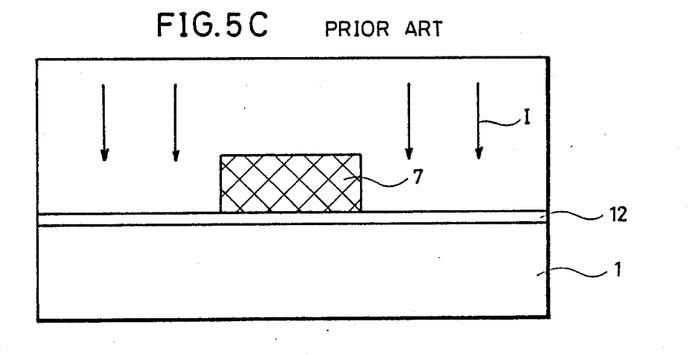

Referring now to cross sectional views of FIGS. 5A to 5C, description is made on manufacturing processes of the transfer gate transistor region.

An oxide film 12 is formed on a semiconductor substrate 1 by thermal oxidation, and a transfer gate electrode material 7m is deposited on the oxide film 12. In addition, exposure L is applied to a resist 13m on the electrode material through a photomask 15 by a photolithographic technique, as shown in FIG. 5A. Consequently, a patterned resist 13 is formed on the electrode material 7m, as shown in FIG. 5B. The exposed transfer gate electrode material 7m is etched utilizing the resist 13 as a mask, so that a transfer gate electrode 7 is formed, as shown in FIG. 5C.

Figure 5D:
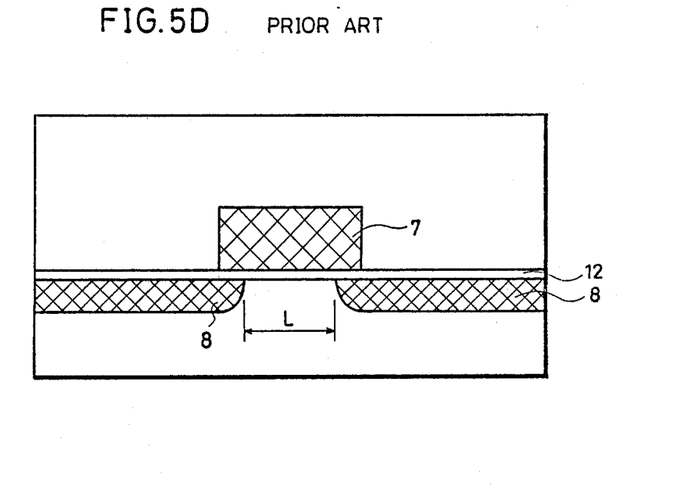

Ions I of a conductivity type opposite to that of the semiconductor substrate 1 are implanted utilizing the transfer gate electrode 7 as a mask, and ion diffused layers 8 of the conductivity type opposite to that of the semiconductor substrate 1 serving as a drain and a source are formed by heat treatment, as shown in FIG. 5D. In the foregoing processes, a transfer gate transistor is manufactured.

The above described method for manufacturing the transfer gate transistor in the conventional memory cell has the following problem.

The ions of the conductivity type opposite to that of the semiconductor substrate 1 are implanted utilizing the transfer gate electrode 7 as a mask, and the ion diffused layers 8 of the conductivity type opposite to that of the semiconductor substrate 1 serving as a drain and a source are formed by heat treatment.

However, the direction of diffusion of ions implanted into the semiconductor substrate 1 at the time of heat treatment includes not only the direction perpendicular to the surface of the semiconductor substrate 1 but also the direction parallel thereto. Thus, the implanted ions are naturally diffused under the transfer gate electrode 7.

As a result, a channel region under the transfer gate electrode 7 becomes narrow, so that an effective gate length (a channel length represented by L) of a transfer gate is decreased. On the other hand, as integration density of the semiconductor device is increased, the length of the transfer gate is decreased, so that a short channel effect such as the drop in threshold voltage, the drop in breakdown voltage between the source and the drain, and degradation of characteristics of the transfer gate transistor caused by a hot carrier effect becomes a serious problem. In such a background of the semiconductor device which is being made fine, the decrease in the effective gate length in the conventional method for manufacturing the transfer gate enhances the above described short channel effect, which is undesirable.

In order to avoid the above described problem, a method of previously calculating the length of the ion diffused layer 8 expanding below the gate electrode 7 and forming the gate electrode 7 having a length including the calculated length is considered. However, this method presents the following new problem.

As shown in FIG. 4, the gate electrode 7 must be formed not to come into contact with the storage node 5 and the contact hole 9. However, the position where the gate electrode 7 is formed depends on the position where the resist 13 is formed, i.e., the position where the photomask 15 is located, as shown in FIGS. 5A and 5B. Thus, in consideration of an error of mask alignment (represented by S) based on the mechanical attachment precision, there is provided margin for the dimension of the position where the gate electrode 7 or the like is formed. Consequently, formation of the gate electrode 7 which is larger than necessary leads to the decrease in this margin. On the other hand, if it is desired to ensure the margin without any decrease, the distance between the central position of the gate electrode 7 and the storage node 5 or the like is increased, which is disadvantageous to a high integration density of the device.

SUMMARY OF THE INVENTION

An object of the present invention is to provide a method for manufacturing a field effect transistor which contributes to high integration density of a semiconductor device.

Another object of the present invention is to provide a method for manufacturing a field effect transistor which can surely control a short channel effect.

Still another object of the present invention is to provide a method for manufacturing a field effect transistor in which an error of mask alignment at the time of forming a gate electrode need not be considered.

A further object of the present invention is to provide a method for manufacturing a field effect transistor in which a channel length is not affected by formation of a gate electrode.

A still further object of the present invention is to provide a method for manufacturing a field effect transistor in which a channel region can be formed by self-alignment.

In order to attain the above described objects, the method for manufacturing the field effect transistor according to the present invention generally comprises a first step for preparing a semiconductor substrate, a second step for forming first and second impurity regions, and a third step for forming a conductor. In the first step, the semiconductor substrate of a first conductivity type having a major surface is prepared. In the second step, the first and second impurity regions of a second conductivity type opposite to the first conductivity type are formed spaced apart from each other by a predetermined distance on the major surface of the semiconductor substrate. In the third step, the conductor is formed over a region of the semiconductor substrate between the first and second impurity regions.

In addition, in accordance with an aspect of the present invention, the method for manufacturing the field effect transistor comprises a first step for preparing a semiconductor substrate, a second step for forming a film, a third step for forming first and second impurity regions, and a fourth step for forming a conductor. In the first step, a semiconductor substrate of a first conductivity type having a major surface is prepared. In the second step, the film having a predetermined width is formed on the major surface of the semiconductor substrate. In the third step, impurities of a second conductivity type opposite to the first conductivity type are implanted into the major surface of the semiconductor substrate utilizing the film as a mask, so that the first and second impurity regions are formed. In the fourth step, the film is removed and then, the conductor is formed over a region of the semiconductor substrate between the first and second impurity regions.

Furthermore, in accordance with another aspect of the present invention, the method for manufacturing the field effect transistor comprises a first step for preparing a semiconductor substrate, a second step for forming first and second conductive layers, a third step for forming first and second impurity regions, and a fourth step for forming a conductor. In the first step, the semiconductor substrate of a first conductivity type having a major surface is prepared. In the second step, the first and second conductive layers including impurities of a second conductivity type opposite to the first conductivity type are formed spaced apart from each other by a predetermined distance on the major surface of the semiconductor substrate. In the third step, impurities in the first and second conductive layers are diffused into the major surface of the semiconductor substrate by heat treatment, so that the first and second impurity regions are formed spaced apart from each other by a predetermined distance. In the fourth step, the conductor is formed on a region of the semiconductor substrate between the first and second impurity regions.

In the method for manufacturing the field effect semiconductor device comprising the foregoing steps, since the channel length is ensured and then, the conductor serving as a gate electrode is formed, an error of mask alignment at the time of forming the gate electrode need not be considered to ensure the channel length. Furthermore, in accordance with another aspect, the channel region can be formed by self-alignment, which further contributes to integration density of the semiconductor device. Thus, according to the present invention, the short channel effect caused by high integration density of the semiconductor device can be prevented, which can significantly contribute to improvement of the reliability of the device.

These objects and other objects, features, aspects and advantages of the present invention will become more apparent from the following detailed description of the present invention when taken in conjunction with the accompanying drawings.

DESCRIPTION OF THE PREFERRED EMBODIMENTS

FIGS. 6A to 6F are schematic cross sectional views showing the steps of a manufacturing method of a memory cell in a DRAM according to an embodiment of the present invention. Referring now to FIGS. 6A to 6F, the manufacturing method thereof will be described.

Figure 6A:
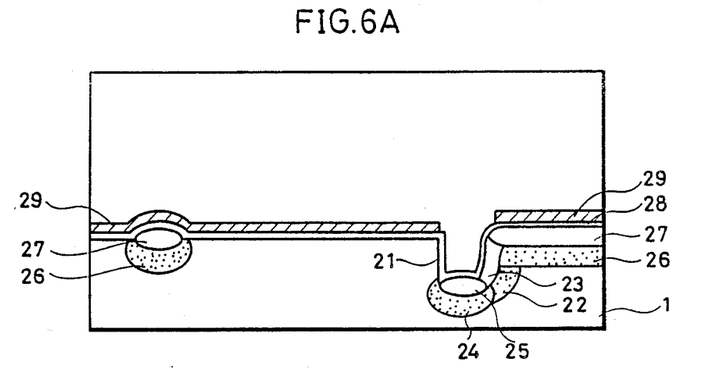
FIGS. 6A to 6F are schematic cross sectional views showing the steps of a manufacturing method of a memory cell in a DRAM according to an embodiment of the present invention.

As shown in FIG. 6A, a trench 21 having an aspect ratio of an approximately unit is formed in a semiconductor substrate 1. Ion diffused layers 22, 24 and 26 of the same conductivity type as that of the semiconductor substrate 1 and oxide films 23, 25 and 27 for cell isolation are formed in a right side surface portion and a bottom surface portion of the trench 21 and a surface portion of the semiconductor substrate 1 on the right of the trench 21. In addition, the ion diffused layer 26 and the oxide film 27 for cell isolation are formed in a position spaced apart, by a predetermined distance, from the trench 21 in the semiconductor substrate 1. Furthermore, the semiconductor substrate 1 including the trench 21 is covered with an underlying oxide film 28, and the oxide film 28 is covered with a nitride film 29 except in the trench 21. The foregoing manufacturing processes are known and hence, the details thereof are not described.

Figure 6B:
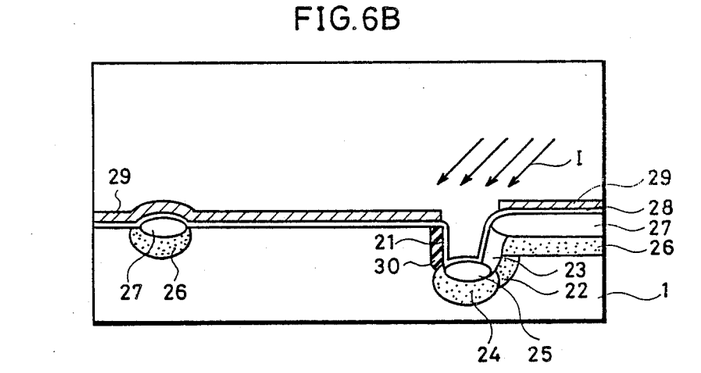

Then, as shown in FIG. 6B, ions I of a conductivity type opposite to that of the semiconductor substrate 1 are obliquely implanted utilizing the nitride film 29 as a mask, so that ions of the conductivity type opposite to the semiconductor substrate 1 are implanted into a left side surface portion of the trench 21. Thereafter, an ion diffused layer 30 of the conductivity type opposite to that of the semiconductor substrate 1 is formed by heat treatment.

Figure 6C:
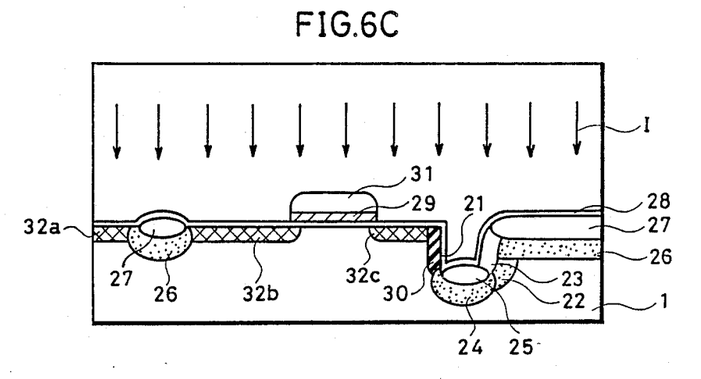
Figure 6D:
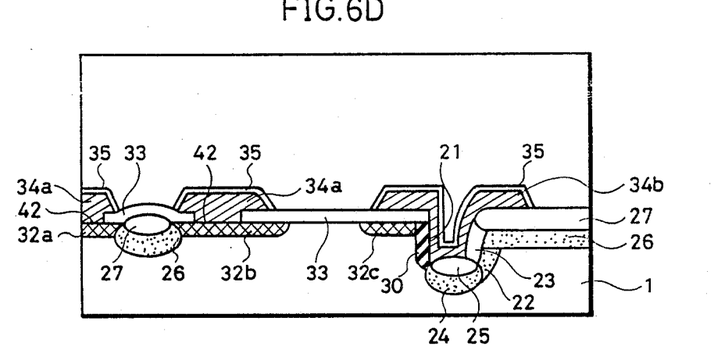

As shown in FIG. 6C, the ions I of the conductivity type opposite to that of the semiconductor substrate 1 are perpendicularly implanted into the semiconductor substrate 1 utilizing as masks a patterned resist 31 and a nitride film 29 etched utilizing the resist 31 as a mask. Thereafter, ion diffused layers 32 (32a, 32b, 32c) of the conductivity type opposite to that of the semiconductor substrate 1 are formed by heat treatment.

After the resist 31 and the nitride film 29 are removed, an oxide film 33 is deposited on the entire surface of the semiconductor substrate 1 by a reduced pressure CVD process and processed using a photolithographic technique, so that contact holes 42 are formed on the ion diffused layers 32a and 32b. In addition, a polysilicon material or the like including impurity ions of the conductivity type opposite to that of the semiconductor substrate 1 is deposited on the entire surface of the semiconductor substrate 1 and processed using the photolithographic technique, so that a storage node 34a in a memory capacitor region and a bit line 34b are simultaneously formed. At that time, the storage node 34a and the bit line 34b are electrically connected to the ion diffused layers 32a and 32b and the ion diffused layer 32c through the contact holes 42 and the ion diffused layer 30, respectively. The storage node 34a and the bit line 34b are covered with a thin insulating film 35 having two-layer structure of, for example, an oxide film and a nitride film (in FIG. 6D).

Figure 6E:
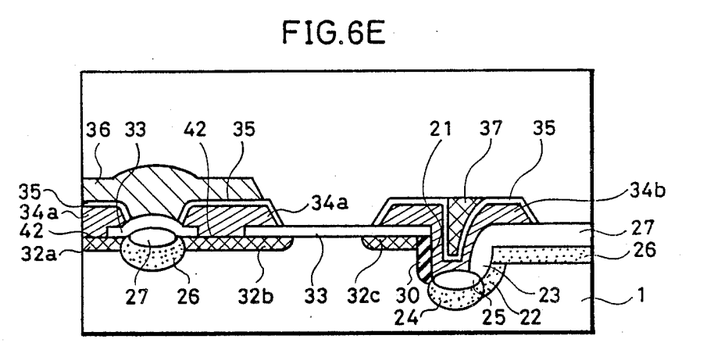

The polysilicon material or the like is deposited on the entire surface of the semiconductor substrate 1 and processed using the photolithographic technique, so that a cell plate 36 is formed on the storage node 34a as shown in FIG. 6E. In addition, an embedded insulating film 37 is embedded in a concave portion of the bit line 34b, to be flattened.

Figure 6F:
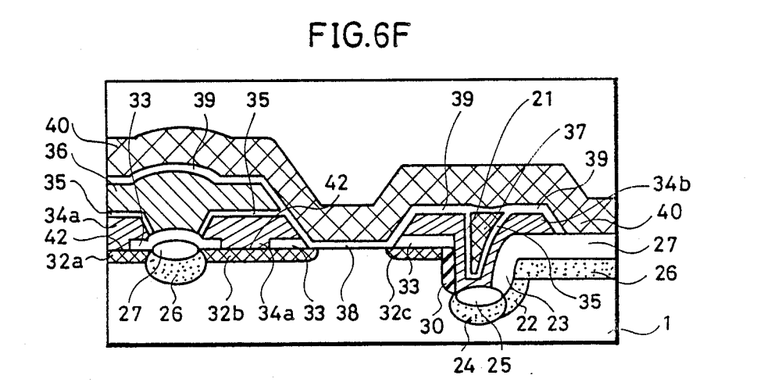

After an exposed oxide film 33 is removed, as shown in FIG. 6F, an oxide film is formed on the entire surface by a thermal oxidation process or the like, and an oxide film 38 for forming a transfer gate and an interlayer insulating film 39 on the cell plate 36 and the bit line 34b are simultaneously formed. Thereafter, a material for word line is deposited on the entire surface and processed using the photolithographic technique, so that a word line 40 is formed.

The foregoing is manufacturing processes of a memory cell according to an embodiment of the present invention. However, a main point of the present invention is a method for manufacturing a transfer gate transistor. Referring now to cross sectional views showing the steps of FIGS. 7A to 7C, the features thereof will be described in detail.

Figure 7A:
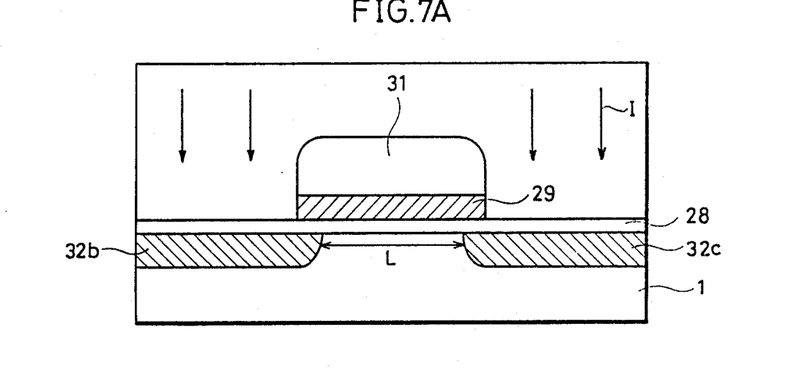
FIGS. 7A to 7C are schematic cross sectional views showing the steps of a manufacturing method of a transfer gate transistor region shown in FIGS. 6A to 6F.

In FIG. 7A, ions I of a conductivity type opposite to that of a semiconductor substrate 1 utilizing a resist 31 and a nitride film 29 as masks, so that ion diffused layers 32 (32b, 32c) of a conductivity type opposite to that of a semiconductor substrate 1 are formed by heat treatment. The spacing between the ion diffused layers 32b and 32c becomes a channel length L.

Figure 7B:
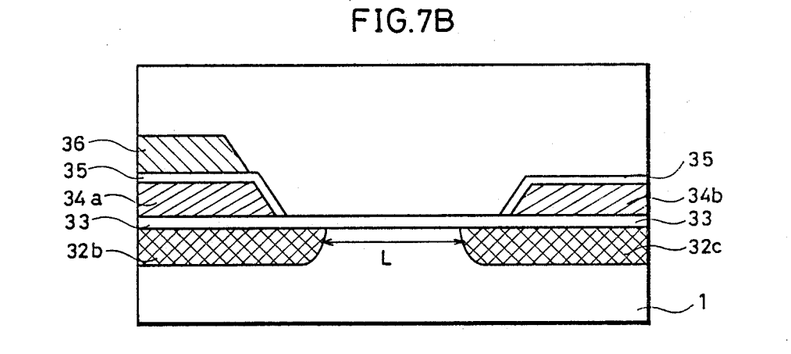

Resist 31, a nitride film 29 and an underlying oxide film 28 are removed, so that an oxide film 33 is formed on the entire surface of the semiconductor substrate 1. A polysilicon material or the like is deposited on the oxide film 33, and a region including the channel length L thereunder is etched as shown in FIG. 7B, so that the polysilicon material or the like is separated into a storage node 34a of a memory capacitor and a bit line 34b. On this occasion, an intermediate region between the storage node 34a and the bit line 34b becomes a transfer gate transistor region. The storage node 34a and the bit line 34b are covered with an insulating film 35 having two-layer structure of an oxide film and a nitride film, and a cell plate 36 is formed on the storage node 34a through the insulating film 35.

Figure 7C:
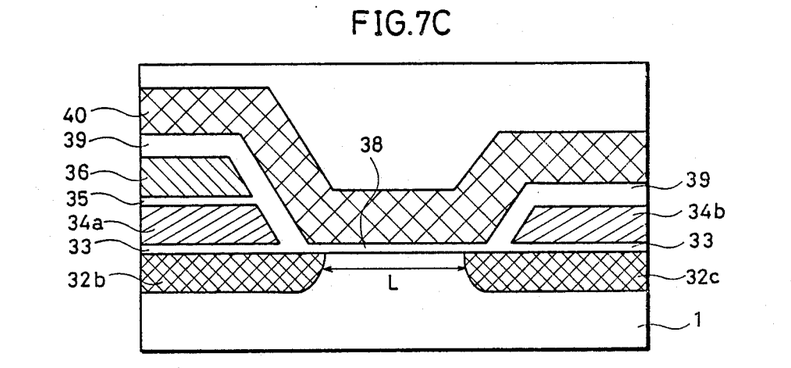

Thereafter, after the exposed insulating film 35 is removed, as shown in FIG. 7C, an oxide film 38 and an interlayer insulating film 39 of an oxide film is formed by thermal oxidation or the like, to simultaneously cover the semiconductor substrate 1. In addition, a material for word line electrode is deposited on the entire surface and etched, so that a word line 40 extending in the direction defined by the storage node 34a and the bit line 34b is formed.

As described above, the polysilicon material or the like integrally formed is separated by etching the region including the channel length L, so that the storage node 34a in the memory capacitor, the bit line 34b and the transfer gate transistor region having the channel length L are simultaneously formed. Conventionally, the memory capacitor region, the transfer gate transistor region and the bit line were positioned, respectively, and sequentially formed. However, according to the present invention, the transfer gate transistor region, the storage node 34a and the bit line 34b are formed by self-alignment without performing a plurality of times of mask processing using the resist in order to position them.

Thus, unlike the conventional example, it is not necessary to consider dimensional margin such that an overlap caused by an error of mask alignment does not occur among the transfer gate transistor region, the storage node 34a and the bit line 34b at the time of designing a photoresist. This dimensional margin can be included in the channel length of the transfer gate transistor. As a result, the channel length L can be increased, so that the short channel effect can be controlled.

Furthermore, since the word line 40 is provided through the oxide film 38 and the interlayer insulating film 39, electrical contact among the storage node 34a, the bit line 34b and the word line 40 can not be made at all if the position of the word line 40 is shifted. More specifically, dimensional margin to avoid the overlap of the word line 40, the storage node 34a and the bit line 34b need not be considered at all.

Furthermore, unlike the conventional example, ion implantation and diffusion for forming a transistor active region utilizing a gate electrode as a mask are not required, so that the word line 40, i.e., the transfer gate electrode and a channel length are completely independent. More specifically, according to the present invention, since the channel length is previously determined, the situation in which the channel length is smaller than the length of the transfer gate electrode due to expansion of the ion diffused layers 32b and 32c below the transfer gate electrode can not be produced as a principle unlike the conventional example.

Figure 8:
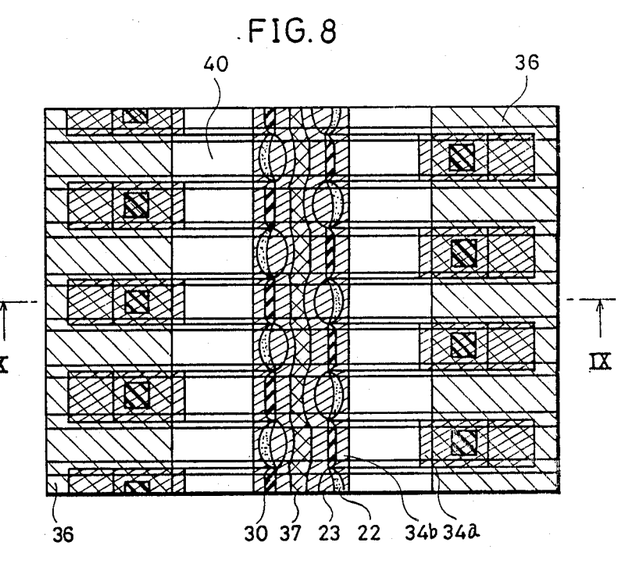
FIG. 8 is a plan view showing a part of a memory cell array manufactured by the manufacturing method shown in FIGS. 6A to 6F and FIGS. 7A to 7C.

FIG. 8 is a plan view showing a part of the memory cell array manufactured in accordance with the manufacturing processes shown in FIGS. 6A to 6F and FIGS. 7A to 7C, and FIG. 9 is a cross sectional view taken along a line IX—IX shown in FIG. 8.

Figure 9:
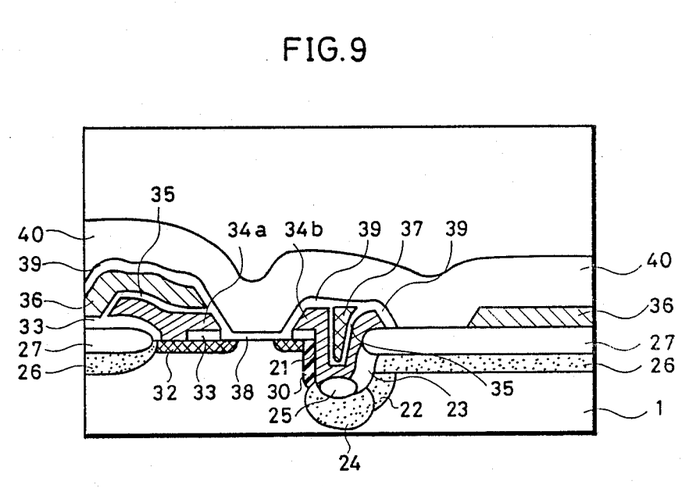
FIG. 9 is a cross sectional view taken along a line IX—IX shown in FIG. 8, showing specific structure of a memory cell.

As can be seen from FIGS. 8 and 9, the word line 40 runs in the direction defined by the storage node 34a and the bit line 34b, and the word line 40 is not perpendicular to the above described direction unlike the conventional device.

FIGS. 10A to 10F are schematic cross sectional views showing the steps of a manufacturing method of a memory cell in a DRAM according to another embodiment of the present invention. Referring now to FIGS. 10A to 10F, description is made on the manufacturing processes.

Figure 10A:
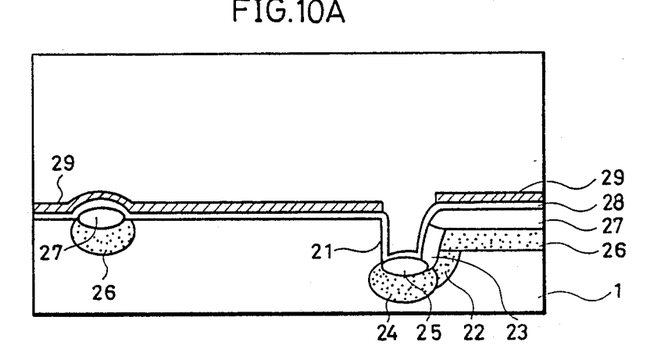
FIGS. 10A to 10F are schematic cross sectional views showing the step of a manufacturing method of a memory cell in a DRAM according to another embodiment of the present invention.

As shown in FIG. 10A, a trench 21 having an aspect ratio of an approximately unit is provided in a semiconductor substrate 1. Ion diffused layers 22, 24 and 26 of the same conductivity type as that of the semiconductor substrate 1 and oxide films 23, 25 and 27 for cell isolation are formed in the right side surface portion and the bottom surface portion of the trench 21 and the surface portion of the semiconductor substrate 1 on the right of the trench 21. In addition, an ion diffused layer 26 and an oxide film 27 for cell isolation are formed in the position spaced apart from the trench 21 in the semiconductor substrate 1 by a predetermined distance. Furthermore, the semiconductor substrate 1 including in the trench 21 is covered with an underlying oxide film 28, and the oxide film 28 is covered with a nitride film 29 except in the trench 21.

Figure 10B:
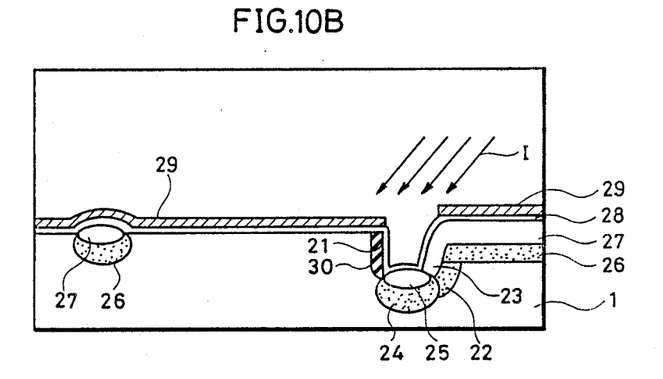

As shown in FIG. 10B, ions I of a conductivity type opposite to that of the semiconductor substrate 1 are obliquely implanted utilizing the nitride film 29 as a mask, so that ions of the conductivity type opposite to that of the semiconductor substrate 1 are implanted into a left side surface portion of the trench 21. Thereafter, an ion diffused layer 30 of the conductivity type opposite to that of the semiconductor substrate 1 is formed by heat treatment.

Figure 10C:
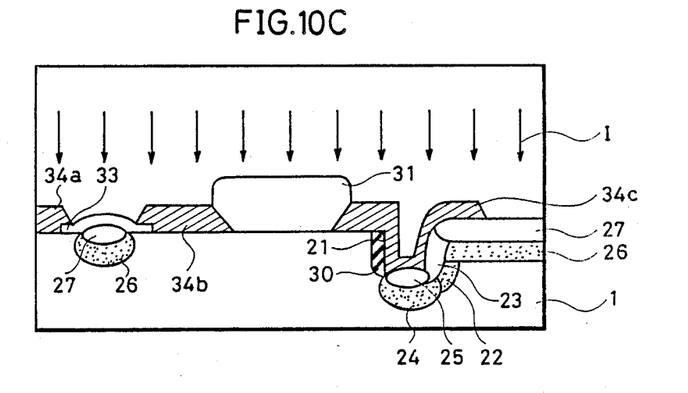

As shown in FIG. 10C, after the nitride film 29 and the underlying oxide film 28 are removed, an oxide film is deposited on the entire surface of the semiconductor substrate 1 by a reduced pressure CVD process or the like and processed using a photolithographic technique, so that an oxide film 33 is left only in a portion which covers the oxide film 27 for isolation. In addition, polysilicon is deposited on the entire surface of the semiconductor substrate 1 and processed using the photolithographic technique, so that storage nodes 34 (34a, 34b) in a memory capacitor region and a bit line 34c are simultaneously isolated from this polysilicon. A patterned resist 31 is provided between the storage node 34b and the bit line 34c. Ions I of a conductivity type opposite to that of the semiconductor substrate 1 are perpendicularly made incident on the entire surface of the semiconductor substrate 1 utilizing the resist 31 as a mask. The ions of the conductivity type opposite to that of the semiconductor substrate 1 are implanted into the storage nodes 34a and 34b and the bit line 34c.

Figure 10D:
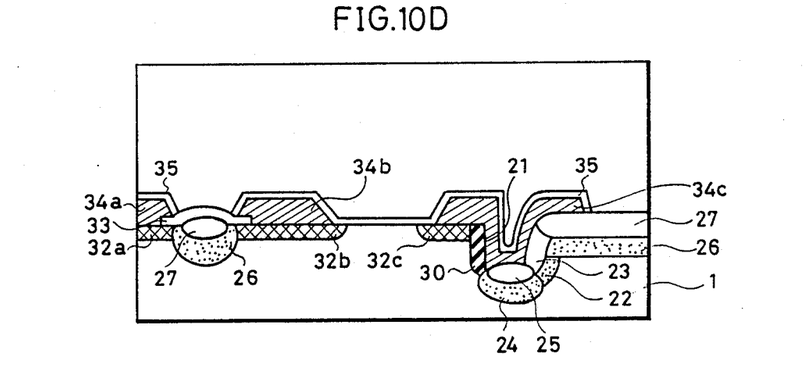

After the resist 31 is removed, ions of the conductivity type opposite to that of the semiconductor substrate 1 included in the storage nodes 34a and 34b and the bit line 34c are diffused into the semiconductor substrate 1 under the storage nodes 34a and 34b and the bit line 34c as shown in FIG. 10D, so that ion diffused layers 32 (32a, 32b, 32c) are formed. In addition, the storage nodes 34a and 34b and the bit line 34c are covered with, for example, a thin insulating film 35 having two-layer structure of an oxide film and a nitride film.

Figure 10E:
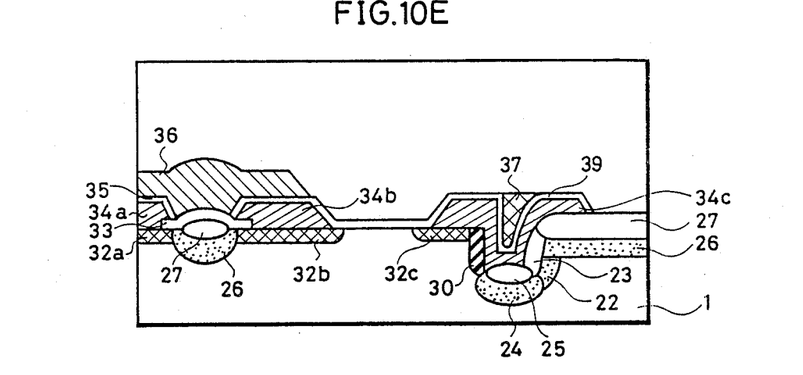

A polysilicon material or the like is deposited on the entire surface of the semiconductor substrate 1 and processed using a photolithographic technique, so that a cell plate 36 is formed over the storage nodes 34a and 34b as shown in FIG. 10E. Furthermore, an embedded insulating film 37 is embedded into a concave portion of the bit line 34c, to be flattened.

Figure 10F:
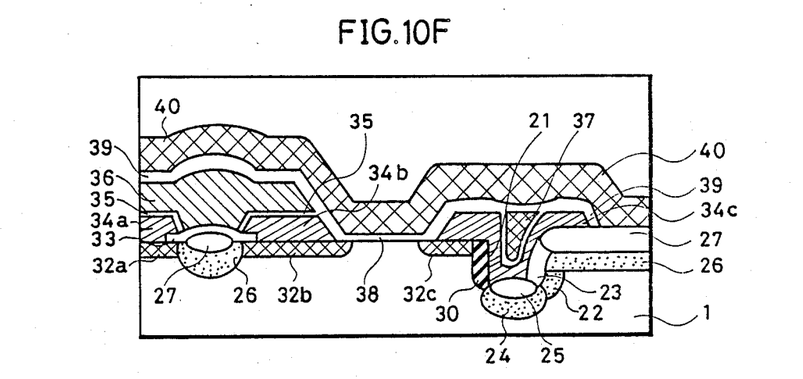

Additionally, after an exposed insulating film 35 is removed, as shown in FIG. 10F, an oxide film is formed on the entire surface by a thermal oxidation process or the like, and an oxide film 38 for forming a transfer gate and an interlayer insulating film 39 on the cell plate 36 and the bit line 34c are simultaneously formed. Thereafter, a material of word line is deposited on the entire surface and processed using the photolithographic technique, so that a word line 40 is formed.

The foregoing is the manufacturing processes of the memory cell according to another embodiment of the present invention. However, a main point of the present embodiment is a method for manufacturing a transfer gate transistor. Referring now to cross sectional views of FIGS. 11A to 11C, the features thereof will be described in detail.

Figure 11A:
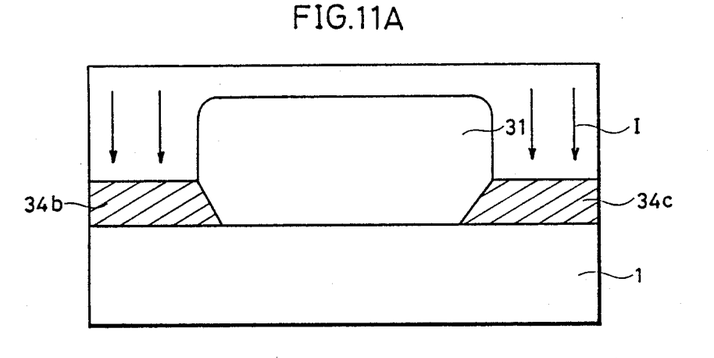
FIGS. 11A to 11C are schematic cross sectional views showing the steps of a manufacturing method of a transfer gate transistor region shown in FIG. 10A to 10F.

In FIG. 11A, polysilicon is deposited on the entire surface of a semiconductor substrate 1 and processed using a photolithographic technique, so that a storage node 34b in a capacitor region and a bit line 34c are simultaneously formed to be isolated from the polysilicon. A patterned resist 31 is formed in an exposed region of the semiconductor substrate 1 by the etching processing. Ions I of a conductivity type opposite to that of the semiconductor substrate are implanted into the storage node 34b and the bit line 34c utilizing the resist 31 as a mask.

Figure 11B:
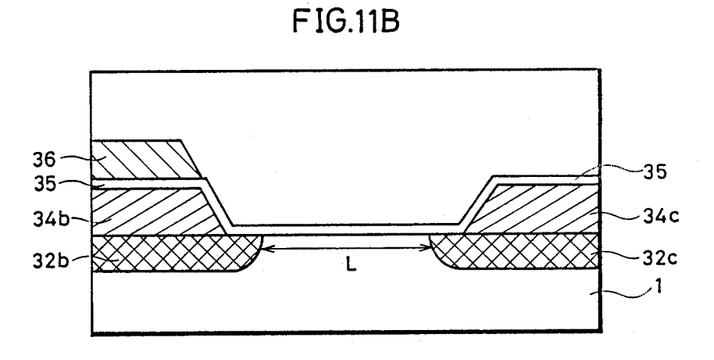

After the resist 31 is removed, ions of the conductivity type opposite to that of the semiconductor substrate 1 included in the storage node 34b and the bit line 34c are diffused into the semiconductor substrate 1 by heat treatment as shown in FIG. 11B, so that ion diffused layers 32 (32b, 32c) are formed. On this occasion, a region between the storage node 34b and the bit line 34c becomes a transfer gate transistor region. The storage node 34b and the bit line 34c are covered with an oxide film 35, and a cell plate 36 is formed over the storage node 34b through the oxide film 35.

Figure 11C:
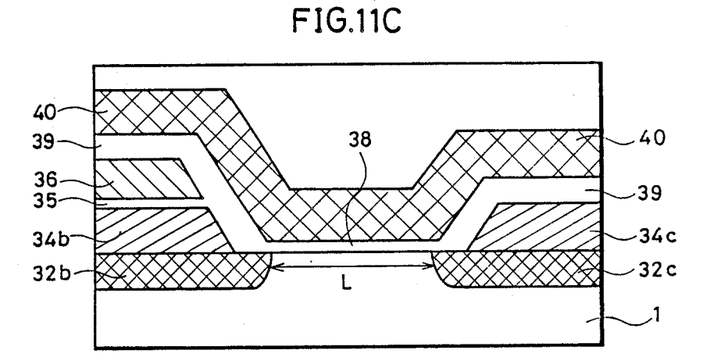

Thereafter, after the exposed oxide film 35 is removed by thermal oxidation or the like, as shown in FIG. 11C, the semiconductor substrate 1 is simultaneously covered with an oxide film 38 and an interlayer insulating film 39, and a material of word line electrode 40 is deposited. A word line 40 is formed in the direction defined by the storage node 34b and the bit line 34c by etching this material of electrode.

As described in the foregoing, according to the present embodiment, the ion diffused layers 32b and 32c are formed by diffusing ions of the conductivity type opposite to that of the semiconductor substrate 1 implanted into the storage node 34b and the bit line 34c by heat treatment. Thus, even if some errors of mask alignment occur in the resist 31, there is no effect on mask alignment in a region where the ion diffused layers 32b and 32c are formed. Thus, in the present embodiment, in addition to the effect of the previous embodiment, a channel region having a channel length L formed between the ion diffused layers 32b and 32c can be also manufactured by self-alignment.

Although in the above described both embodiments, the word line 40 is provided parallel to the direction defined by the storage node 34b and the bit line 34c, the word line 40 can be provided perpendicular thereto as in the conventional example (FIGS. 3 and 4). However, in the manufacturing method according to the present invention, the word line 40 is finally provided. Thus, if the word line 40 is perpendicularly provided, the width direction of the word line 40 must be precisely positioned in the transfer gate transistor region between the storage node and the bit line, so that an error of mask alignment occurs in positioning. Therefore, it is desirable to form the word line 40 as in the above described both embodiments.

Additionally, although in the above described both embodiments, the memory transfer gate transistor is exemplified, the present invention can be applied to a method for manufacturing a transistor in another device.

As described in the foregoing embodiments, according to the present invention, since an impurity region is formed to ensure a channel length and then, a conductor serving as a gate electrode is formed, an error of mask alignment at the time of forming the conductor never affect formation of the channel length. Thus, a field effect transistor in which a considerable channel length is ensured can be manufactured while satisfying integration density of a semiconductor device. In addition, as described in the latter embodiment, according to the present invention, since a channel region is formed by self-alignment, a field effect transistor which can significantly contribute to integration density and the reliability of a semiconductor device can be manufactured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a field effect transistor, comprising the steps of:
   preparing a semiconductor substrate of a first conductivity type having a major surface,
   forming a film having a predetermined width on the major surface of said semiconductor substrate,
   wherein the step of forming said film comprises the steps of:
   forming a first insulating film on the major surface of said semiconductor substrate,
   forming on said first insulating film a second insulating film having said film as a part thereof, and patterning said second insulating film,
   implanting impurities of a second conductivity type opposite to said first conductivity type into the major surface of said semiconductor substrate utilizing said film as a mask, to form first and second impurity regions,
   removing said film and then, forming a conductor over a region of said semiconductor substrate serving as a channel region between said first and second impurity regions;
   wherein the step of forming said conductor comprises the steps of:
   removing said film and said first insulating film,
   forming a third insulating film on the major surface of said semiconductor substrate exposed by removing said first insulating film,
   forming first and second conductive layers on said third insulating film and over said first and second impurity regions, respectively,
   forming a fourth insulating film on the surfaces of said first and second conductive layers,
   forming a third conductive layer on said fourth insulating film and over said first conductive layer,
   removing said third insulating film on the major surface of said semiconductor substrate,
   forming a fifth insulating film to cover the surfaces of said first, second and third conductive layers including the major surface of said semiconductor substrate exposed by removing said third insulating film, forming on said fifth insulating film a fourth conductive layer having said conductor as a part thereof, and patterning said fourth conductive layer.

2. The method according to claim 1, wherein the step of forming said first and second impurity regions comprises the steps of implanting said impurities into said semiconductor substrate through said first insulating film, and diffusing said implanted impurities by heat treatment.

3. The method according to claim 1, wherein said conductor is formed in the direction orthogonal to a channel width direction of said channel region and to bridge said first and second impurity regions.

4. The method according to claim 3, wherein said field effect transistor constitutes a part of the semiconductor memory device, and said first and second impurity regions comprise a source or drain electrode, a part of said conductor comprises a control electrode, the other portion of said conductor comprises a word line, said second conductive layer comprises a part of a bit line, and said first and third conductive layers comprise a part of a capacitor.

5. A method for manufacturing a field effect transistor, comprising the steps of:

preparing a semiconductor substrate of a first conductivity type having a major surface, forming first and second conductive layers including impurities of a second conductivity type opposite to said first conductivity type on the major surface of said semiconductor substrate spaced apart from each other by a predetermined distance, diffusing said impurities in said first and second conductive layers into the major surface of said semiconductor substrate by heat treatment, to form first and second impurity regions spaced apart from each other by a predetermined distance, and forming a conductor on a region of said semiconductor substrate serving as a channel region between said first and second impurity regions.

6. The method according to claim 5, wherein the step of forming said first and second conductive layers comprises the steps of forming conductive films serving as said first and second conductive layers on the major surface of said semiconductor substrate, patterning said conductive films, to expose the major surface of said semiconductor substrate by a predetermined width, forming a film to cover an exposed portion of the major surface of said semiconductor substrate, implanting said impurities into said first and second conductive layers utilizing said film as a mask, and removing said film.

7. The method according to claim 6, wherein the step of forming said conductor comprises the steps of forming a first insulating film on said first and second conductive layers including the major surface of said semiconductor substrate exposed by removing said film, forming a third conductive layer on said first insulating film and over said first conductive layer, removing said first insulating film on the major surface of said semiconductor substrate, forming a second insulating film to cover the surfaces of said first, second and third conductive layers including the major surface of said semiconductor substrate exposed by removing said first insulating film, forming on said second insulating film a fourth conductive layer having said conductor as a part thereof, and patterning said fourth conductive layer.

8. The method according to claim 7, wherein said conductor is formed in the direction orthogonal to a channel width direction of said channel region and to bridge said first and second impurity regions.

9. The method according to claim 8, wherein said field effect transistor constitutes a part of a semiconductor memory device, and said first and second impurity regions comprises a source or drain electrode, a part of said conductor comprises a control electrode, the other portion of said conductor comprises a word line, said second conductive layer comprises a part of a bit line, and said first and third conductive layers comprise a part of a capacitor.

10. A method for manufacturing a field effect transistor, comprising the steps of:

preparing a semiconductor substrate of a first conductivity type having a major surface, forming first and second impurity region of a second conductivity type opposite to said first conductivity type on the major surface of said semiconductor substrate spaced apart from each other by a predetermined distance, forming a conductor over a region of said semiconductor substrate serving as a channel region between said first and second impurity regions, wherein said step of preparing a semiconductor substrate includes the step of forming a trench in the major surface of said semiconductor substrate, and the further step of obliquely implanting impurities of said second conductivity type opposite to said first conductivity type in one side of said trench.

11. The method according to claim 10 comprising the further step of forming a substantially vertical diffusion layer by heat treatment of said impurities obliquely implanted in the side of said trench.

12. The method according to claim 10 including a further step of providing diffusion layers beneath and adjacent said trench on a side opposite to said side obliquely implanted, and separating said ion-diffusion layers from said trench by an oxide film.

* * * * *